(12) United States Patent
King et al.

(10) Patent No.: US 6,245,643 B1
(45) Date of Patent: Jun. 12, 2001

(54) METHOD OF REMOVING POLYSILICON RESIDUAL IN A LOCOS ISOLATION PROCESS USING AN ETCHING SELECTIVITY SOLUTION

(75) Inventors: Wei-Shang King, Taipei; Chien-Hung Chen, Taipei Hsien; Ming-Kuan Kao, Hsin-Chu, all of (TW)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/304,013

(22) Filed: Apr. 30, 1999

(51) Int. Cl.[7] ................................................. H01L 21/76
(52) U.S. Cl. ............................................. 438/439; 438/444
(58) Field of Search ...................................... 438/439, 444

(56) References Cited

U.S. PATENT DOCUMENTS 5,789,305 * 8/1998 Peidous .
5,849,626 * 12/1998 Song .
5,940,720 * 8/1999 Hong .
6,100,164 * 8/2000 Youn et al. .

* cited by examiner

Primary Examiner—John F. Niebling
Assistant Examiner—Josetta Jones

(74) Attorney, Agent, or Firm—Chien-Wei (Chris) Chou; Oppenheimer Wolff & Donnelly LLP

(57) ABSTRACT

A method of forming a field oxide isolation region includes: forming a first pad oxide layer over a semiconductor substrate; forming a silicon nitride layer over the first pad oxide layer; patterning and etching the silicon nitride layer and the first pad oxide layer to expose a portion of the substrate, and simultaneously forming an undercut cavity; forming a second pad oxide layer over the exposed portion of the substrate; depositing a layer of polysilicon over the second pad oxide layer, the polysilicon layer filling the undercut cavity to form a polysilicon plug; removing portions of the polysilicon layer to form a polysilicon spacer; thermally oxidizing the substrate to substantially consume the polysilicon spacer but leave a polysilicon residual of the polysilicon plug, the thermal oxidation forming a thick oxide above the exposed portion of the substrate; substantially removing the silicon nitride layer; applying a first etching solution to the first pad oxide layer and the polysilicon residual, the first etching solution providing selective etching of the first pad oxide layer and the polysilicon residual so that the polysilicon residual is substantially removed and the first pad oxide layer is partially removed leaving a first pad oxide layer residual; and applying a second etching solution to remove the first pad oxide layer residual, thereby leaving the thick oxide to form the isolation region.

15 Claims, 6 Drawing Sheets

METHOD OF REMOVING POLYSILICON RESIDUAL IN A LOCOS ISOLATION PROCESS USING AN ETCHING SELECTIVITY SOLUTION

BACKGROUND OF THE INVENTION

1. Field of the Invention

This invention relates generally to the manufacturing of integrated circuits, and in particular, to a method of removing polysilicon residual formed during a local oxidation of silicon (LOCOS) isolation process using an etching selectivity solution.

2. Description of the Prior Art

A continuing trend today in the design of integrated circuits (IC's) is to increase circuit density thereby incorporating more circuit devices into a given area of an IC chip. Techniques for increasing device density of an IC include techniques for reducing the size of active areas of devices in the IC, and techniques for reducing the size of isolation areas between adjacent active areas. The goal of such efforts is to reduce the overall size of the IC's without compromising performance.

FIG. 1A illustrates a cross-sectional view of a portion of an IC 10 as manufactured in accordance with a typical prior art local oxidation of silicon (LOCOS) based method. Devices, or components, of the IC 10 are typically formed using a substrate 12. A first step in semiconductor manufacturing is the division of the substrate 12 into: an active area 14 in which thin-film layers are formed on and above substrate 12 to create active devices of the IC; and a field oxide region 16 providing isolation between adjacent ones of the active areas. The layers formed in the active area 14 typically include: a pad oxide layer 18 (e.g., $SiO_2$) formed on and above substrate 12; a silicon nitride ($Si_3N_4$) layer 20 formed on and above pad oxide layer 18 for masking purposes as further explained below; and ion implanted, or doped regions (not shown) formed within substrate 12.

FIG. 1B illustrates a detailed view of a typical transition region, or bird's beak, 22 formed in the field oxide region 16 at an interface between the active area 14 and the field oxide region 16 as a result of a typical prior art LOCOS based prior art method of forming the field oxide region. The field oxide region 22 is referred to as a "birds beak" because it is characterized by a graduated increase in thickness as it extends in a direction from the pad oxide layer 18 to the field oxide region 16. If a field oxide region is formed to have a long bird's beak 22, then the bird's beak 22 of the field oxide region extends under the masking silicon nitride layer 20, thereby encroaching upon otherwise usable portions of the active area 14. Also, the bird's beak creates stress and defects in the silicon in the active areas.

In order to increase the density of the IC, it is desirable to reduce the length of the bird's beak 22. However, reducing the length of bird's beak 22 may compromise IC performance characteristics. For example, decreasing the length of bird's beak 22 may degrade the isolation effect provided by field oxide region 16, thereby causing a leakage current. Thus, there is a design tradeoff between the length of bird's beak 22 and IC performance characteristics. Several prior art techniques have been developed for minimizing the length of the bird's beak without significantly compromising IC performance characteristics. For example, U.S. Pat. No. 5,393,692, (entitled "Recessed Side-Wall Poly Plugged Local Oxidation", invented by Wu, and assigned to Taiwan Semiconductor Manufacturing Company) discloses a method of forming a field oxide isolation region with reduced bird's beak length.

FIGS. 2A–2D illustrate cross-sectional views of an IC 50 at sequential steps of a prior art LOCOS based method of forming a field oxide isolation region having reduced bird's beak encroachment into active areas. Referring to FIG. 2A, initial steps of the prior art method include: forming a first pad oxide layer 54 of silicon dioxide ($SiO_2$) on and over a substrate 52; forming a silicon nitride ($Si_3N_4$) layer 56 on and over the first pad oxide layer 54 for the purpose of masking; and performing photolithography and isotropic (wet) etching, as illustrated by lines 58, in order to selectively remove portions of the silicon nitride layer, first pad oxide layer, thereby exposing a portion of the top surface of the substrate 52. As a result of these steps, active regions 60 are defined. Because of the characteristics of isotropic etching, which typically include an undercutting effect, a cavity 62 is formed below each of the silicon nitride layers 56 adjacent to the field oxide region.

Referring to FIG. 2B, a second pad oxide layer 64 of silicon dioxide is grown on and over the exposed portion of substrate 52. Subsequently, polysilicon material is deposited over the substrate 52, and an etch back step is performed to form a polysilicon spacer 66 adjacent to the silicon nitride layer in the active regions 60. A polysilicon plug is formed in the cavity 62 (FIG. 2A) underlying the silicon nitride layer 56. As explained below, the polysilicon spacer 66, which is used to form the field oxide region, provided for reducing the length of the bird's beak 22 (FIG. 1B). Also, the polysilicon plug formed in the cavity 62 along the edges of the active region 60 is intentionally formed to inhibit encroachment of the bird's beak 22 (FIG. 1B) into the active region 14.

Referring to FIG. 2C, the prior art method of forming a field oxide further includes performing a LOCOS based process of oxidizing the substrate 52 to form a field oxide layer 68 by subjecting the substrate 52 to a high temperature and oxygen rich environment causing rapid oxidation. During the field oxidation process, the polysilicon spacer 66 and polysilicon plug formed in the cavity 62 provide barrier structures in order to achieve reduction of bird's beak encroachment. The polysilicon spacer 66 is substantially consumed. However, the polysilicon plug in the cavity 62 (FIG. 2A), is at least partially protected from exposure during the LOCOS based oxidation process by the silicon nitride layer 56. As a result, the polysilicon plug in the cavity 62 is not completely oxidized, and a polysilicon residual 70 of the polysilicon plug remains in the cavity 62.

Referring to FIG. 2D, the silicon nitride layer 56 and the pad oxide layer 54 of the active region 60 are removed by wet etching. A problem arises in this procedure because the polysilicon residual 70 may not be dissolved by a conventional etch solution, such as hydrofloride (HF), and therefore polysilicon residual material remains in the etch solution and flows into a solution tank (not shown). The resulting problem is that after completion of the wet etching process, the polysilicon residual material remaining in the etching solution can cause contamination of the IC 50 during subsequent processing steps. It is therefore necessary in the prior art process to change the etching solution and clean the tank after the step of wet etching the silicon nitride layer 56 and the pad oxide layer 54 of the active region 60.

Thus, there is a need for a method of removing polysilicon residual of a polysilicon plug used in limiting encroachment of a bird's beak of a field oxide isolation region, wherein etching solution needed for subsequent process steps is not contaminated by the polysilicon residual.

SUMMARY OF THE INVENTION

Briefly, a presently preferred embodiment of the present invention provides an improved method of forming a field oxide isolation region in a semiconductor device. The method includes an advantageous selective etching sub-process for efficiently removing polysilicon residual of a polysilicon plug which is used in limiting encroachment of the "bird's beak" of the field oxide isolation region into an active region.

The method of forming a field oxide isolation region includes the steps of: forming a first pad oxide layer over a semiconductor substrate; forming a silicon nitride layer over the first pad oxide layer; patterning and etching the silicon nitride layer and the first pad oxide layer to expose a portion of the substrate substantially defining the boundaries of the isolation region, and simultaneously forming an undercut cavity by removing a portion of the first pad oxide layer under exposed edges of the silicon nitride layer surrounding the exposed portion of the substrate; forming a second pad oxide layer over the exposed portion of the substrate; depositing a layer of polysilicon over the second pad oxide layer, the silicon nitride layer, and the exposed edges, the polysilicon layer filling the undercut cavity and forming a polysilicon plug inside the cavity; removing portions of the polysilicon layer lying over the silicon nitride layer and a central portion of the second pad oxide layer leaving a polysilicon spacer bounding the exposed edges; and thermally oxidizing the substrate to substantially consume the polysilicon spacer but leave a polysilicon residual of the polysilicon plug, the thermal oxidation forming a thick oxide above the exposed portion of the substrate.

The method of forming a field oxide isolation region includes the steps of: substantially removing the silicon nitride layer; applying a first etching solution to the first pad oxide layer and the polysilicon residual, the first etching solution providing selective etching of the first pad oxide layer and the polysilicon residual so that the polysilicon residual is substantially removed and the first pad oxide layer is partially removed leaving a first pad oxide layer residual; and applying a second etching solution to remove the first pad oxide layer residual, thereby leaving the thick oxide to form the isolation region. In an embodiment, the first etching selectivity solution comprises HF, $HNO_3$, and $CH_3COOH$. Also, in an embodiment, the second etching selectivity solution comprises HF.

An important advantage of the method of the present invention is that etching solution needed for subsequent processing steps is not contaminated in the course of removing polysilicon residual from the field oxide isolation region.

DETAILED DESCRIPTION OF THE PREFERRED EMBODIMENTS

Figure 1A:
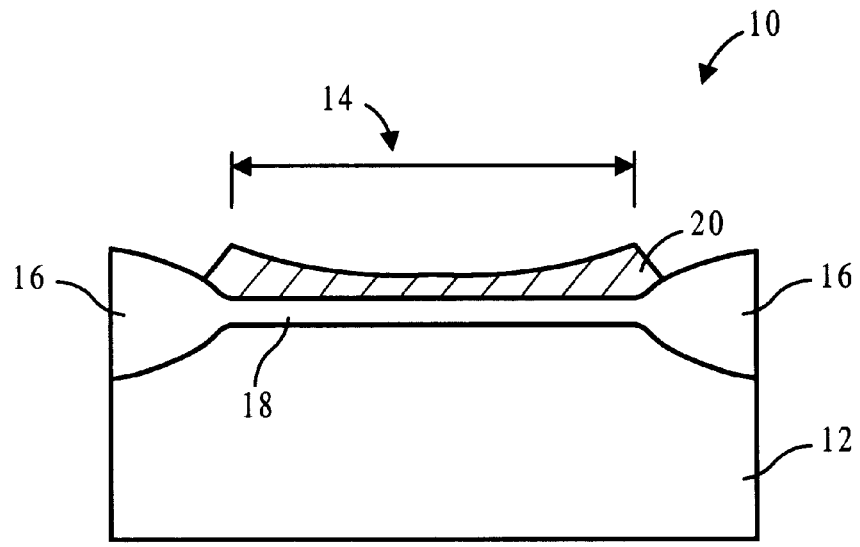
FIG. 1A a illustrates a cross-sectional view of a portion of an integrated circuit (IC) including an active area formed adjacent to a field oxide isolation region.
Figure 1B:
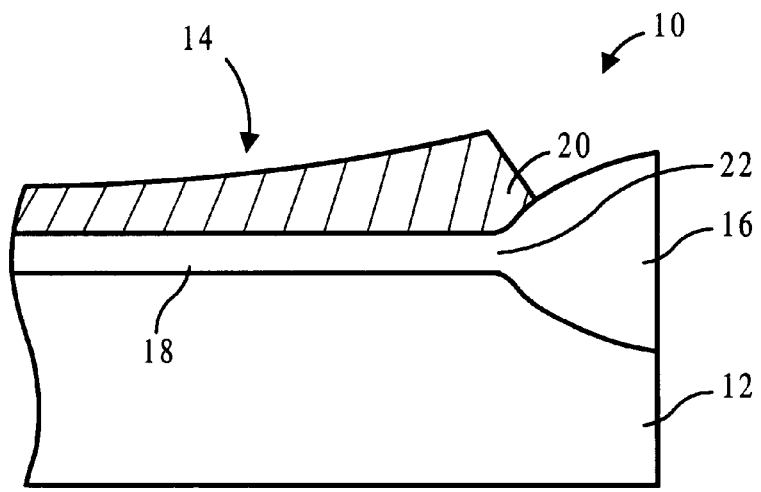
FIG. 1B illustrates a cross-sectional view of a "bird's beak" of the field oxide isolation region encroaching upon an otherwise usable portion of the active area of the IC of FIG. 1.
Figure 2A:
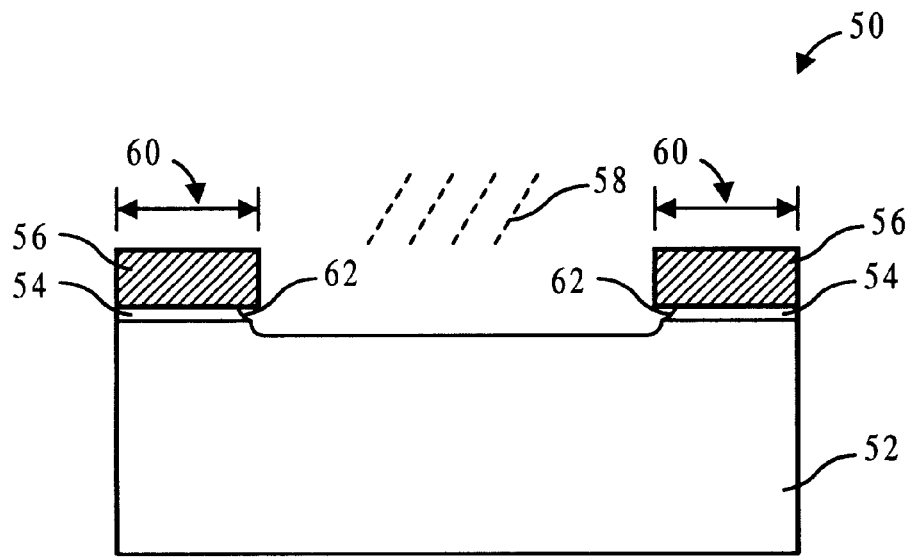
FIGS. 2A–2D illustrate cross-sectional views of an IC at sequential steps of a prior art method of forming a field oxide isolation region in the IC.
Figure 2B:
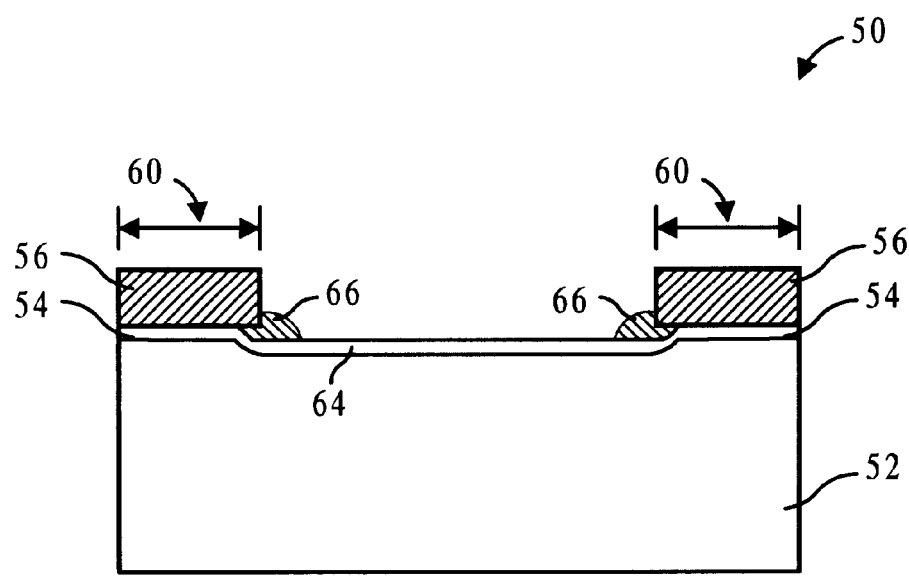
Figure 2C:
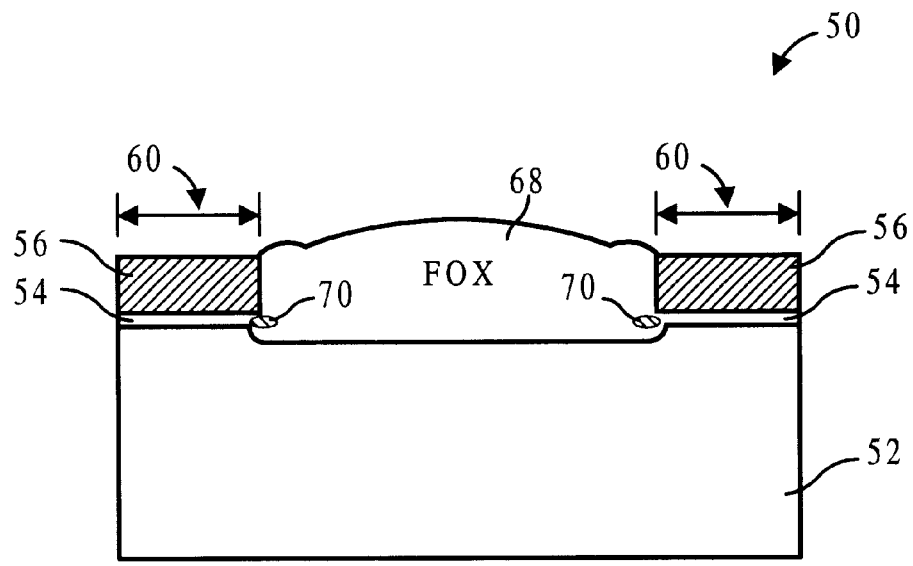
Figure 2D:
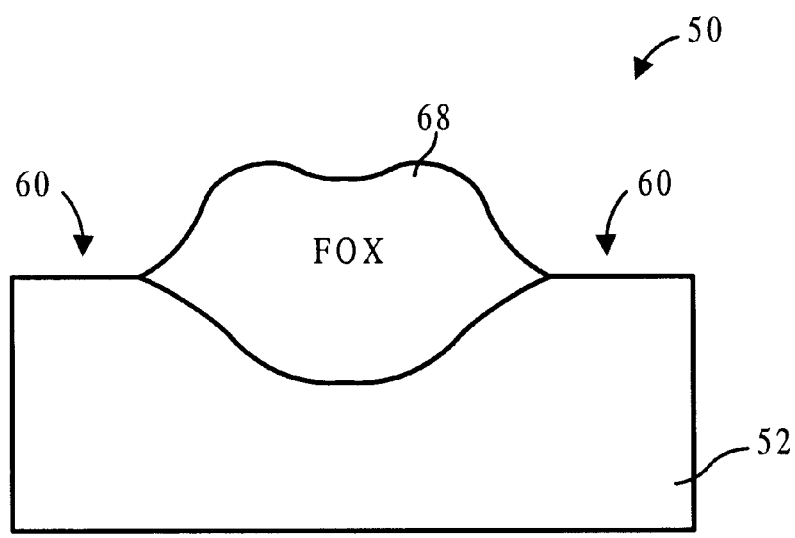
Figure 3A:
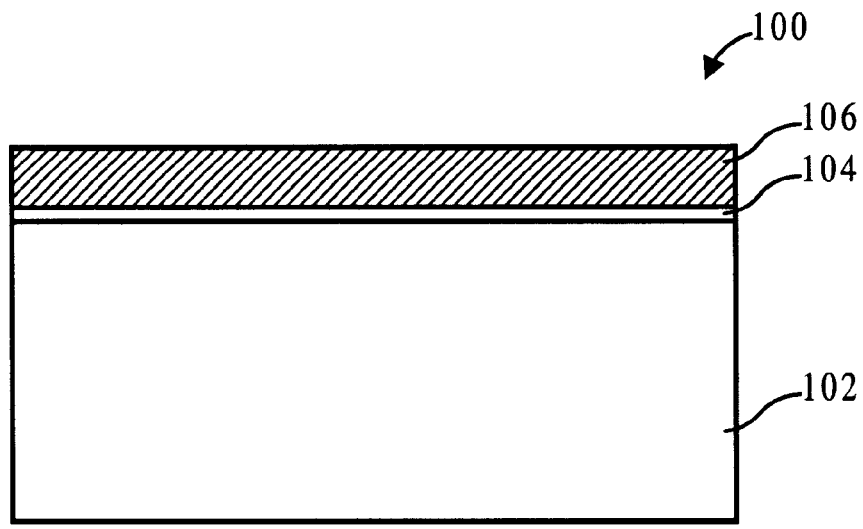
FIGS. 3A–3G illustrate cross-sectional views of an IC at sequential steps of a method of forming a field oxide isolation region in accordance with the present invention.

FIGS. 3A–3G illustrate cross-sectional views of an integrated circuit (IC) 100 at sequential steps of an exemplary method of forming a field oxide isolation region in accordance with the present invention. Referring to FIG. 3A, a first procedure in the method of forming a field oxide includes the steps of: forming a first pad oxide 104, such as silicon dioxide ($SiO_2$), on and over a substrate 102; and forming a layer of silicon nitride ($Si_3N_4$) 106 on and over the pad oxide layer 104. In one embodiment, the silicon dioxide layer 104 is formed by thermally growing the oxide to a thickness of about 100 to 400 Angstroms at a temperature of about 700 to 1000 degrees Celsius. Also, in an embodiment, the silicon nitride layer 106 is formed by depositing polysilicon material with low pressure chemical vapor deposition (LPCVD) using two gases comprising $SiH_2Cl_2$ and $NH_3$ at a temperature of about 760 degrees Celsius and a pressure of about 350 mTorr, so that the silicon nitride layer 106 reaches a thickness of approximately 1500 to 2500 Angstroms.

Figure 3B:
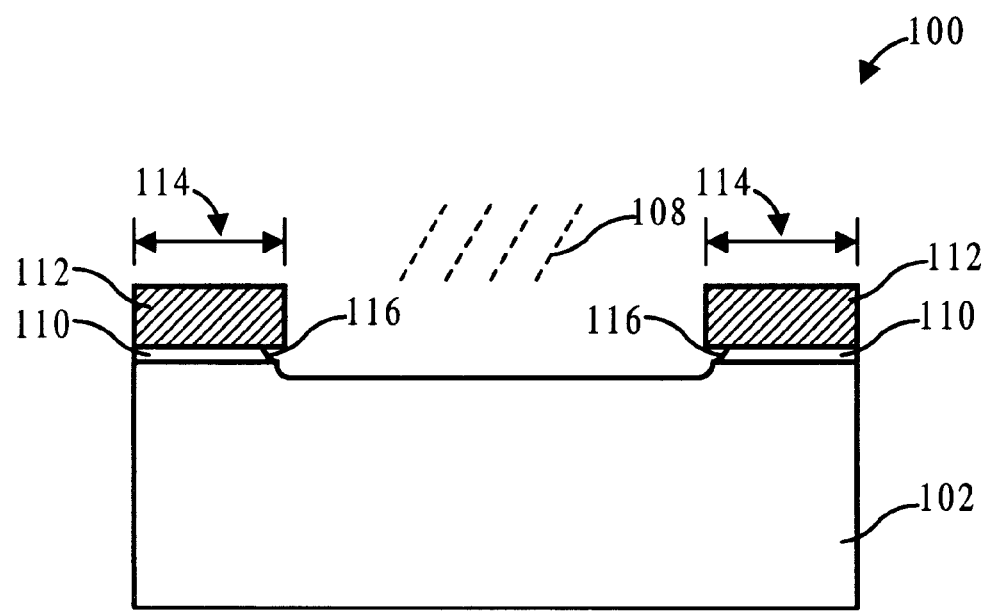

Referring to FIG. 3B, a subsequent procedure in the method of forming a field oxide includes substantially removing the first pad oxide layer 104 (FIG. 3A), silicon nitride layer 106 (FIG. 3A), and a portion of the top surface of substrate 102 from a region of substrate 102 where a field oxide is to be formed, thereby exposing a portion of said substrate 102.

In an embodiment, this step includes: using conventional lithography and etching techniques to form a patterned photoresist oxidation mask (not shown) on the active area, and to create an opening in the silicon nitride layer thereby exposing a portion of the pad oxide layer 110. In one embodiment, this removing step is performed in accordance with a plasma anisotropic etching, or dry etching process as illustrated by lines 108; and then performing isotropic (wet) etching of the pad oxide layer 110. The plasma anisotropic etching at a power of about 525 Watts, at a pressure of about 400 mTorr, using argon (Ar) at a flow rate of about 320 sccm (standard cubic centimeter per minute), $CHF_3$ at a flow rate of about 20 sccm, and oxygen ($O_2$) at a flow rate of about 50 sccm.

By removing portions of the pad oxide layer 104 and silicon nitride layer 106 within the field oxide region, an active area 114 is defined, the active area 114 including remaining portions of the pad oxide layer and the silicon nitride layer. These portions are designated respectively as pad oxide layer 110 and silicon nitride layer 112. The pad oxide layer 110 and silicon nitride layer 112 protect the active areas 114 during a subsequent oxidation process, as explained below. As a result of the etching process, a small cavity 116 is typically formed under each of the silicon nitride masks 112 in an area adjacent to the field oxide region.

Figure 3C:
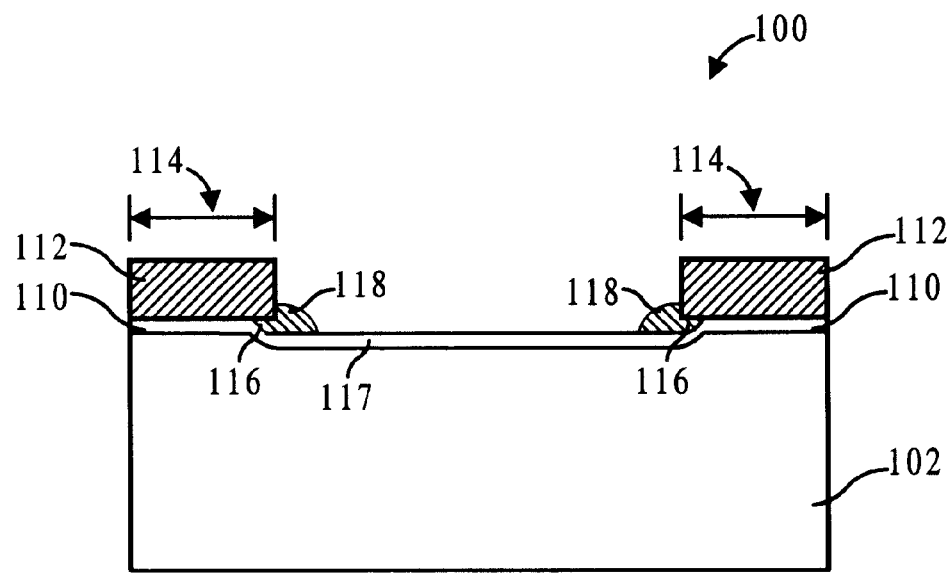

Referring to FIG. 3C, a subsequent procedure in the method of forming a field oxide includes the steps of: forming a second pad oxide layer 117, such as silicon dioxide ($SiO_2$), on and over the exposed portion of the substrate 102; forming a thick polysilicon layer on and over the second pad oxide layer 117; and etching the polysilicon layer to form polysilicon spacers 118 adjacent the silicon nitride layer 112. Note that portions of the polysilicon spacers 118 are located below respective silicon nitride masks 112 within the cavities 116. In one embodiment, the new pad oxide layer 117 is formed by thermally growing the oxide in an oxygen environment. Also, in an embodiment, the polysilicon spacers 118 are formed by depositing $SiH_4$ using low pressure chemical vapor deposition (LPCVD) at a temperature of about 620 degrees Celsius and at a pressure of about 200 mTorr, and then performing a plasma anisotropic etching step using fluoride as the reaction gas.

Figure 3D:
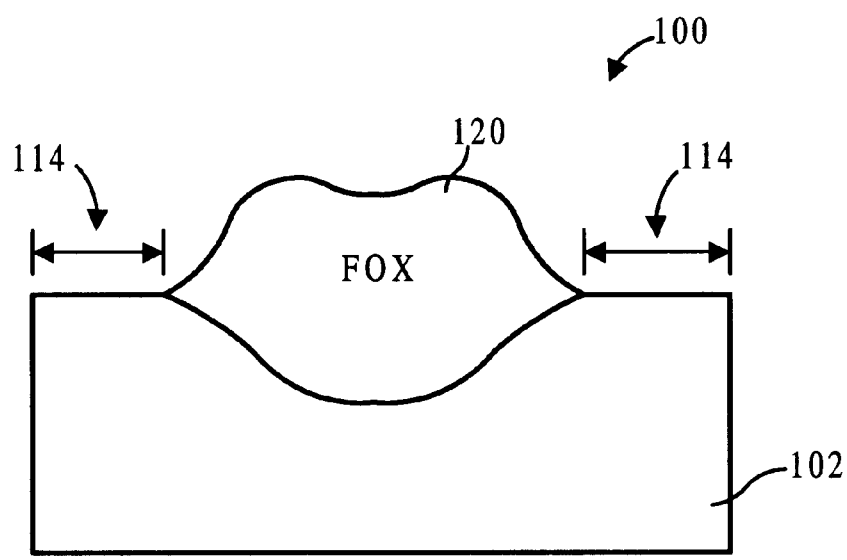

Referring to FIG. 3D, a subsequent procedure in the method of the invention includes a steps of forming a field oxide 120 within the field oxide region using the silicon nitride 112 in the active area 114 as an oxidation mask; and then removing the silicon nitride layer 112. In the preferred embodiment, the field oxide 120 is grown to a thickness of approximately 3500 to 6000 Angstroms by subjecting the IC 100 to a high temperature oxygen ($O_2$) rich environment, at a temperature of about 1000 degrees Celsius, for a duration of about 150 to 480 minutes. Also, in one embodiment, the removal of the silicon nitride masks 112 is performed by subjecting the IC 100 to a heated solution of $H_3PO_4$. Next, the pad oxide 110 is removed by a two-step wet etching process.

Figure 3E:
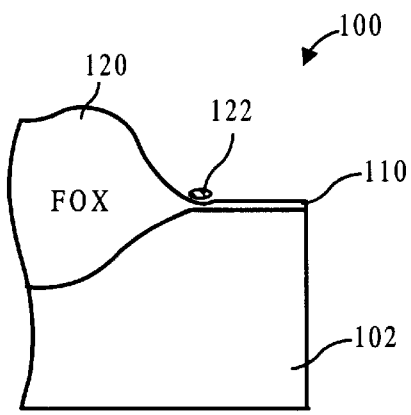

Referring to FIG. 3E, a polysilicon residual 122 remains in the field oxide 120 after forming the field oxide 120 because during this step, the high temperature oxygen environment that causes the oxidation of the polysilicon spacer 118 may not penetrate through the whole polysilicon spacer 118. This is particularly true for portions of the polysilicon spacers 118 that lie within cavities 116 below the silicon nitride ($Si_3N_4$) layer 112. The silicon nitride layer 112 protects the polysilicon spacer 118. Accordingly, a polysilicon residual 122 is typically formed in the cavities 116 (FIG. 3C) proximate the interface of the field oxide 120 and pad oxide layer 110. The polysilicon residual 122 is undesirable because it may provide a source of defects for the IC 100.

Figure 3F:
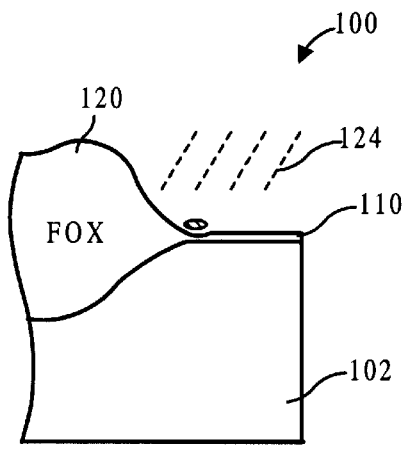

Referring to FIG. 3F, the method of forming a field oxide further includes a selective etching step in which the IC 100 is subjected to an etching selectivity solution as illustrated by lines 124 in order to substantially remove the polysilicon residual 122 while removing only a portion of the pad oxide layer 110. An etching selectivity solution as defined herein is a solution that has a higher etching rate for one material, and a lower etching rate for another material. In the method of the present invention, the etching selectivity solution has an etching rate that is higher for polysilicon material than for the field oxide 120 and pad oxide 110 (e.g., silicon dioxide $SiO_2$) materials. Thus, the etching selectivity solution 124 etches away the polysilicon residual 122 and a small portion of the pad oxide layer 110. In the preferred embodiment, the etching selectivity solution includes a mixture of HF and $HNO_3$ Alternatively, the etching selectivity solution may also include a mixture of HF, $HNO_3$ and $CH_3COOH$. In this case, the etching rate ratio (ERR) is approximately between 13 and 18.

Figure 3G:
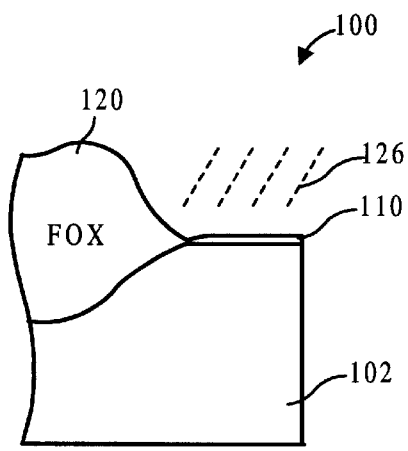

Referring to FIG. 3G, the method of forming a field oxide further includes a step of substantially removing a remaining portion of the pad oxide layer 110 from the top surface of the substrate 102, the remaining portion being that which was not removed by subjecting the IC 100 to the etching selectivity solution. In one embodiment, the IC 110 is subjected to a five percent (5%) solution of hydrofloride (HF) as illustrated by lines 126 in order to remove the remaining portion of the pad oxide layer 110. Thus, a well formed field oxide 120 is formed with essentially no polysilicon residual.

An advantage of the method of forming a field oxide in accordance with the invention is that substantially all of the unwanted polysilicon residual remaining in the oxide layers is removed. As a result, the yield of IC's undergoing the method of the invention substantially increases. Therefore, production cost and lead time pertaining to the manufacturing of an IC using the method of the present invention is substantially decreased. Removal of the polysilicon residual occurs during the cycle of removing the silicon nitride masks 112 and the pad oxide 110, which involve subjecting the integrated circuit to particular solutions. Thus, the method of the invention saves production cost, reduces lead times, and reduces the complexity of the manufacturing process.

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

What is claimed is:

1. A method of forming a field oxide isolation region in a semiconductor device, comprising the steps of:

forming a first pad oxide layer over a semiconductor substrate;

forming a silicon nitride layer over said first pad oxide layer;

patterning and etching said silicon nitride layer and said first pad oxide layer to expose a portion of said substrate substantially defining the boundaries of the isolation region, and simultaneously forming an undercut cavity by removing a portion of said first pad oxide layer under the exposed edges of said silicon nitride layer surrounding said exposed portion;

forming a second pad oxide layer over said exposed portion of said substrate;

depositing a layer of polysilicon over said second pad oxide layer, said silicon nitride layer, and said exposed edges, said polysilicon layer filling said undercut cavity and forming a polysilicon plug and inside said cavity;

removing portions of said polysilicon layer lying over said silicon nitride layer and a central portion of said second pad oxide layer leaving a polysilicon spacer bounding said exposed edges;

thermally oxidizing said substrate to substantially consume said polysilicon spacer but leave a polysilicon residual of said polysilicon plug, said thermal oxidation forming a thick oxide above said exposed portion of said substrate;

substantially removing said silicon nitride layer;

applying a first etching solution to said first pad oxide layer and said polysilicon residual, said first etching solution providing selective etching of said first pad oxide layer and said polysilicon residual so that said polysilicon residual is substantially removed and said first pad oxide layer is partially removed leaving a first pad oxide layer residual; and applying a second etching solution to remove said first pad oxide layer residual, thereby leaving said thick oxide to form the isolation region.

2. The method of claim 1, wherein said first etching selectivity solution comprises HF.

3. The method of claim 2, wherein said first etching selectivity solution further comprises $HNO_3$.

4. The method of claim 3, wherein said first etching selectivity solution further comprises $CH_3COOH$.

5. The method of claim 1 wherein said second etching selectivity solution comprises HF.

6. The method of claim 1, wherein said step of forming said silicon nitride layer comprises depositing silicon nitride material to a thickness of about 1500 to 2500 Angstroms by a low pressure chemical vapor deposition using $SiH_2Cl_2$ and $NH_3$, at a temperature of about 760 degrees Celsius, and at a pressure of about 350 mTorr.

7. The method of claim 1, wherein said step of patterning and etching said silicon nitride layer and said first pad oxide layer comprises anisotropically etching said silicon nitride layer and said first pad oxide layer using Ar at a flow rate of approximately 320 sccm, $O_2$ at a flow rate of approximately 50 sccm, and $CHF_3$ at a flow rate of approximately 20 sccm, at a pressure of approximately 400 mTorr.

8. The method of claim 1, wherein said step of depositing said layer of polysilicon includes low pressure chemical vapor deposition using $SiH_4$, at a temperature of about 620 degrees Celsius, at a pressure of about 200 mTorr.

9. The method of claim 1, wherein said step of forming said field oxide isolation region in and on said substrate subjecting said substrate to an oxygen environment at a temperature of about 1000 degrees Celsius, for a duration of about 150 to 480 minutes, said field oxide isolation region having a resulting thickness of about 3500 to 6000 Angstroms.

10. The method of claim 1, wherein said step of removing said silicon nitride layer comprises subjecting said silicon nitride layer to a heated solution of $H_3PO_4$.

11. A method for removing polysilicon residual of a polysilicon plug used for limiting encroachment of a bird's beak of a field oxide isolation region during a process of fabricating the field oxide isolation region, said polysilicon residual remaining in a pad oxide layer formed over the substrate and below a silicon nitride layer, comprising the steps of:

substantially removing said silicon nitride layer;

applying a first etching solution to said pad oxide layer and said polysilicon residual, said first etching solution providing selective etching of said pad oxide layer and said polysilicon residual so that said polysilicon residual is substantially etched away and said pad oxide layer is partially etched away leaving a pad oxide layer residual; and applying a second etching solution to remove said pad oxide layer residual.

12. The method of claim 11, wherein said first etching selectivity solution comprises HF.

13. The method of claim 12, wherein said first etching selectivity solution further comprises $HNO_3$.

14. The method of claim 13, wherein said first etching selectivity solution further comprises $CH_3COOH$.

15. The method of claim 11 wherein said second etching selectivity solution comprises HF.

\* \* \* \* \*